(12) United States Patent
Franken et al.

(10) Patent No.: US 7,554,105 B2
(45) Date of Patent: Jun. 30, 2009

(54) LITHOGRAPHIC APPARATUS AND DEVICE MANUFACTURING METHOD

(75) Inventors: Dominicus Jacobus Petrus A. Franken, Veldhoven (NL); Erik Roelof Loopstra, Heeze (NL); Pertrus Rutgerus Bartray, Ijsselsteijn (NL); Marc Wilhelmus Maria Van Der Wijst, Veldhoven (NL); Michael Jozef Mathijs Renkens, Sittard (NL); Gerard Van Schothorst, Hedel (NL); Johan Juliana Dries, Aerendonk (BE)

(73) Assignee: ASML Netherlands B.V., Veldhoven (NL)

(*) Notice: Subject to any disclaimer, the term of this patent is extended or adjusted under 35 U.S.C. 154(b) by 74 days.

(21) Appl. No.: 11/263,012

(22) Filed: Nov. 1, 2005

(65) Prior Publication Data

US 2006/0060799 A1  Mar. 23, 2006

Related U.S. Application Data

(63) Continuation of application No. 10/615,421, filed on Jul. 9, 2003, now Pat. No. 7,049,592.

(30) Foreign Application Priority Data

Jul. 11, 2002  (EP) .................................. 02254863

(51) Int. Cl.
*G21K 5/10* (2006.01)
(52) U.S. Cl. ............................... 250/492.2; 250/442.11; 355/53
(58) Field of Classification Search ............... 250/492.2
See application file for complete search history.

(56) References Cited

U.S. PATENT DOCUMENTS

| 5,229,872 | A | | 7/1993 | Mumola |
| 5,296,891 | A | | 3/1994 | Vogt et al. |
| 5,508,518 | A | | 4/1996 | Kendall |
| 5,523,193 | A | | 6/1996 | Nelson |
| 5,969,411 | A | | 10/1999 | Fukaya |
| 6,036,162 | A | * | 3/2000 | Hayashi ...................... 248/550 |
| 6,046,792 | A | | 4/2000 | Van Der Werf et al. |
| 6,222,614 | B1 | | 4/2001 | Ohtomo |

(Continued)

FOREIGN PATENT DOCUMENTS

EP   1 081 521 A2   3/2001

(Continued)

OTHER PUBLICATIONS

European Search Report for App. No. EP 03 25 4358 mailed Nov. 11, 2004, 3 pgs.
Translation of Japanese Office Action issued in Japanese Application No. 2003-293218 mailed Aug. 15, 2006.

*Primary Examiner*—David A. Vanore
*Assistant Examiner*—Phillip A. Johnston
(74) *Attorney, Agent, or Firm*—Sterne, Kessler, Goldstein & Fox P.L.L.C

(57) ABSTRACT

A lithographic apparatus includes a projection system mounted on a reference frame, which in turn is mounted on a base which supports the apparatus. Vibrations and displacement errors in the base are filtered through two sets of isolation mounts operatively between the base and reference frame and between the reference frame and a projection frame of the projection system and therefore disturbance of the projection system is reduced.

22 Claims, 3 Drawing Sheets

U.S. PATENT DOCUMENTS

| | | |
|---|---|---|
| 6,262,796 B1 | 7/2001 | Loopstra et al. |
| 6,285,444 B1 | 9/2001 | Osanai et al. |
| 6,750,625 B2 | 6/2004 | Binnard et al. |
| 7,049,592 B2 | 5/2006 | Fraken et al. |
| 2002/0118346 A1* | 8/2002 | Galburt et al. ............... 355/53 |
| 2003/0197914 A1 | 10/2003 | Cox et al. |
| 2004/0065847 A1 | 4/2004 | Franken et al. |

FOREIGN PATENT DOCUMENTS

| | | |
|---|---|---|
| EP | 1 220 037 A2 | 7/2002 |
| EP | 1 237 044 A2 | 9/2002 |
| JP | 4-34245 A | 2/1992 |
| JP | 4-50054 A | 2/1992 |
| JP | 8-108819 A | 4/1996 |
| JP | 9-148237 A | 6/1997 |
| JP | 11-294520 A | 10/1999 |
| JP | 11-317350 A | 11/1999 |
| JP | 2000-58441 A | 2/2000 |
| JP | 2000-126983 A | 5/2000 |
| WO | WO 98/33096 A1 | 7/1998 |
| WO | WO 98/38597 A2 | 9/1998 |
| WO | WO 98/38597 A3 | 9/1998 |

* cited by examiner

LITHOGRAPHIC APPARATUS AND DEVICE MANUFACTURING METHOD

CROSS REFERENCE TO RELATED APPLICATIONS

This application is a continuation of U.S. application Ser. No. 10/615,421, filed Jul. 9, 2003, now U.S. Pat. No. 7,049,592, which claimed priority to European Application 02254863.0, filed Jul. 11, 2002, the entire contents of both applications being incorporated herein by reference in their entirety.

BACKGROUND OF THE INVENTION

1. Field of the Invention

The present invention relates to a lithographic projection apparatus and device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In order to accurately expose the substrate, the projection system must be mounted on the apparatus in such a manner that any vibrations or displacements within the apparatus do not affect the position of the elements within the projection system. This is critical since the projection system contains many optical elements connected to a projection frame which must be accurately positioned relative to one another and relative to other components in the apparatus. Displacements and vibrations of the projection frame may cause so-called rigid body errors in which the projection frame as a whole is displaced and the optical elements within it are displaced relative to other components in the apparatus.

In addition the vibrations and distortions of the projection frame may cause flexure and/or strains in the projection frame which reduce the accuracy of the relative positions of the elements mounted on the projection frame. Both sources of positional inaccuracy of the optical elements (relative to the remainder of the apparatus and relative to the other elements) reduce the accuracy of the projection of the image onto the substrate.

It has therefore been previously known to rigidly mount the projection frame onto a reference frame which is compliantly mounted on the base of the apparatus. Such a reference frame is used to support components of the apparatus, such as position sensors, that are sensitive to vibrations. By compliantly mounting, or "soft-mounting", the reference frame on the base, vibrations and displacements acting on the base (which may be caused by, for example, reaction forces from actuators positioning other components of the apparatus) will be low-pass filtered by the mounts and the disturbance on the reference frame, and hence the projection frame and the optical elements, is reduced. However, as the critical dimension of devices produced using the lithography process decreases, the required accuracy of the apparatus increases. Therefore, the continuing increase in demand for smaller device dimensions requires that the tolerable position error within the projection optics be reduced. In order to allow for this reduction, the soft-mount for the reference frame must be improved to reduce the vibration transmitted from the base of the apparatus to the reference frame. In conventional lithographic apparatus the soft-mounts may be so-called "air-mounts" in which the reference frame is supported on an air cushion of some restricted volume. In order to improve such an air-mount to meet the requirements for the maximum vibration being passed to the projection optics, the air-mounts supporting the reference frame must be increased in size. However the space available around the lithographic projection apparatus is limited and, therefore, when the required performance for the mounts (driven by the dimension of the devices to be formed on the substrate) reaches a given value, the conventional arrangements supporting the projection frame are no longer appropriate.

Furthermore, even where the reference frame is sufficiently isolated from the base, additional vibrations may be introduced to the reference frame by, for example, water cooling tubes.

SUMMARY OF THE INVENTION

It is an aspect of the present invention to provide a lithographic apparatus in which the projection frame is supported in such a manner that the vibration and positional errors transmitted to it are reduced or eliminated.

This and other aspects are achieved according to the present invention in a lithographic apparatus including a radiation system configured to provide a beam of radiation; a support configured to support a patterning device, the patterning device configured to pattern the beam according to a desired pattern; a substrate table configured to hold a substrate; a projection system configured to project the patterned beam onto a target portion of the substrate; a base to which the support and the substrate table are mounted; and a reference frame, compliantly mounted to the base, wherein the projection system comprises at least one optical element mounted on a projection frame that is compliantly mounted to the reference frame.

The present invention limits vibrations transmitted to the projection system by using mounts for the reference frame which are not larger than conventional mounts. Other elements of the lithographic apparatus, which do not need this level of positional accuracy, may be mounted to the reference frame in the conventional manner.

Preferably, the eigenfrequency of the mounting of the projection frame on the reference frame is between about 10 and 30 Hz and the eigenfrequency of the mounting of the reference frame on the base is about 0.5 Hz. This results in very low levels of vibration being transmitted from the base to the projection system, but the size of the mounts for the reference frame will still be within practical limits.

The motion of the projection frame relative to the reference frame may be damped. This reduces the displacement of the projection frame relative to the reference frame at the low frequencies around the resonant frequency of the mounting.

In a preferred embodiment of the present invention, the projection frame is mounted on the reference frame using compliant mounts that are attached to the reference frame on the nodal axes of the dominant mode of bending vibration or torsional vibration of the reference frame. As such bending or torsional vibration of the reference frame produces the greatest distortion of the reference frame but, by mounting it in this fashion, very little of this distortion will be transmitted to the projection frame.

In one embodiment the compliant mounts used to mount the projection frame onto the reference frame are at least one of an air-mount, a spring and a magnetic support. These mounts have responses that are predictable.

According to an alternative embodiment, the compliant mounts are formed from a T-shaped member with one of the projection frame and reference frame attached to both ends of the cross-piece and the other attached to the end of the leg. This compliant mount requires very little maintenance, can easily be replaced and may be simply tuned by adjusting the lengths and widths of the cross-piece and leg members.

According to a further preferred embodiment, the T-shaped member has an internal first eigenfrequency that is greater than 1000 Hz. In this way vibrational problems related to the suspension of the projection system can be avoided.

According to a further aspect of the invention there is provided a device manufacturing method including projecting a patterned beam of radiation onto a target portion of a layer of radiation-sensitive material at least partially covering a substrate using a projection system; supporting a reference frame, a support configured to support a patterning device and a substrate table configured to hold the substrate on a base, wherein the reference frame is compliantly mounted to the base and the projection system is mounted to the reference frame; and compliantly mounting the projection system to the reference frame while projecting the patterned beam of radiation onto the target portion.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
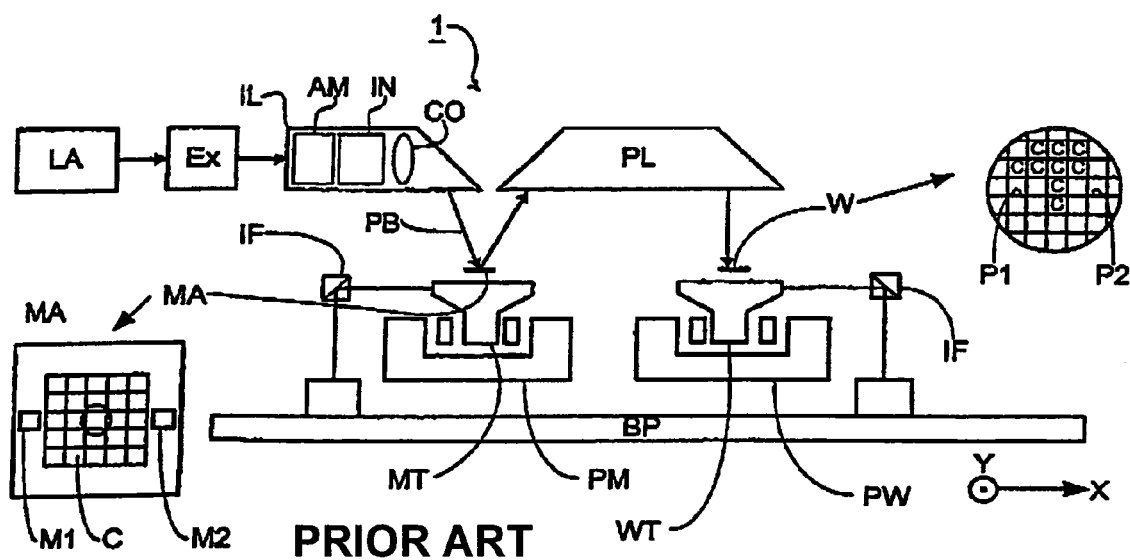
FIG. 1 depicts a lithographic projection apparatus according to an embodiment of the present invention.

FIG. 1 schematically depicts a lithographic projection apparatus 1 according to an embodiment of the invention. The apparatus 1 includes a base BP; a radiation system Ex, IL configured to supply a beam PB of radiation (e.g. EUV radiation), which in this particular case also comprises a radiation source LA; a first object (mask) table MT provided with a mask holder configured to hold a mask MA (e.g. a reticle), and connected to a first positioning device PM that accurately positions the mask with respect to a projection system or lens PL; a second object (substrate) table WT provided with a substrate holder configured to hold a substrate W (e.g. a resist-coated silicon wafer), and connected to a second positioning device PW that accurately positions the substrate with respect to the projection system PL. The projection system or lens PL (e.g. a mirror group) is configured to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
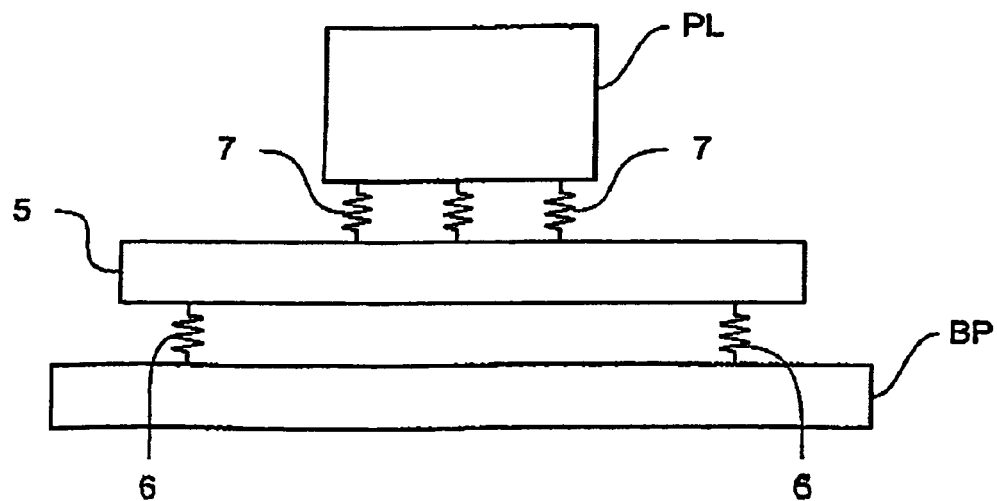
FIG. 2 depicts a projection system mounted according to the present invention.

FIG. 2 shows the projection system PL mounted to an isolated reference frame 5. The reference frame 5 is, in turn, mounted on the base BP of the apparatus. Compliant mounts 6 support the reference frame 5. The mounts 6 have low-pass characteristics and may have an eigenfrequency of between about 0.1 Hz and 10 Hz and preferably have an eigenfrequency of approximately 0.5 Hz. The mounts 6 therefore attenuate the transmission of any vibrations or displacements from the base BP to the reference frame 5. The attenuation of vibrations is necessary as the vibrations in the base BP will be larger than the maximum allowed in the projection system PL. The vibrations in the base frame may be caused by, for example, reaction forces from the actuators used to position the elements of the apparatus. However, despite the use of the mounts 6, the amplitude of the vibrations in the reference frame 5 may be larger than the maximum allowable in the projection system PL. Therefore the projection system PL is mounted to the reference frame 5 by compliant mounts 7. The mounts 7 present low-pass characteristics, having cut-off or eigenfrequencies of, for example, between about 10 and about 30 Hz. The soft-mounting of the projection system PL on the reference frame 5 therefore further filters the vibration and motion of the base BP.

Figure 3:
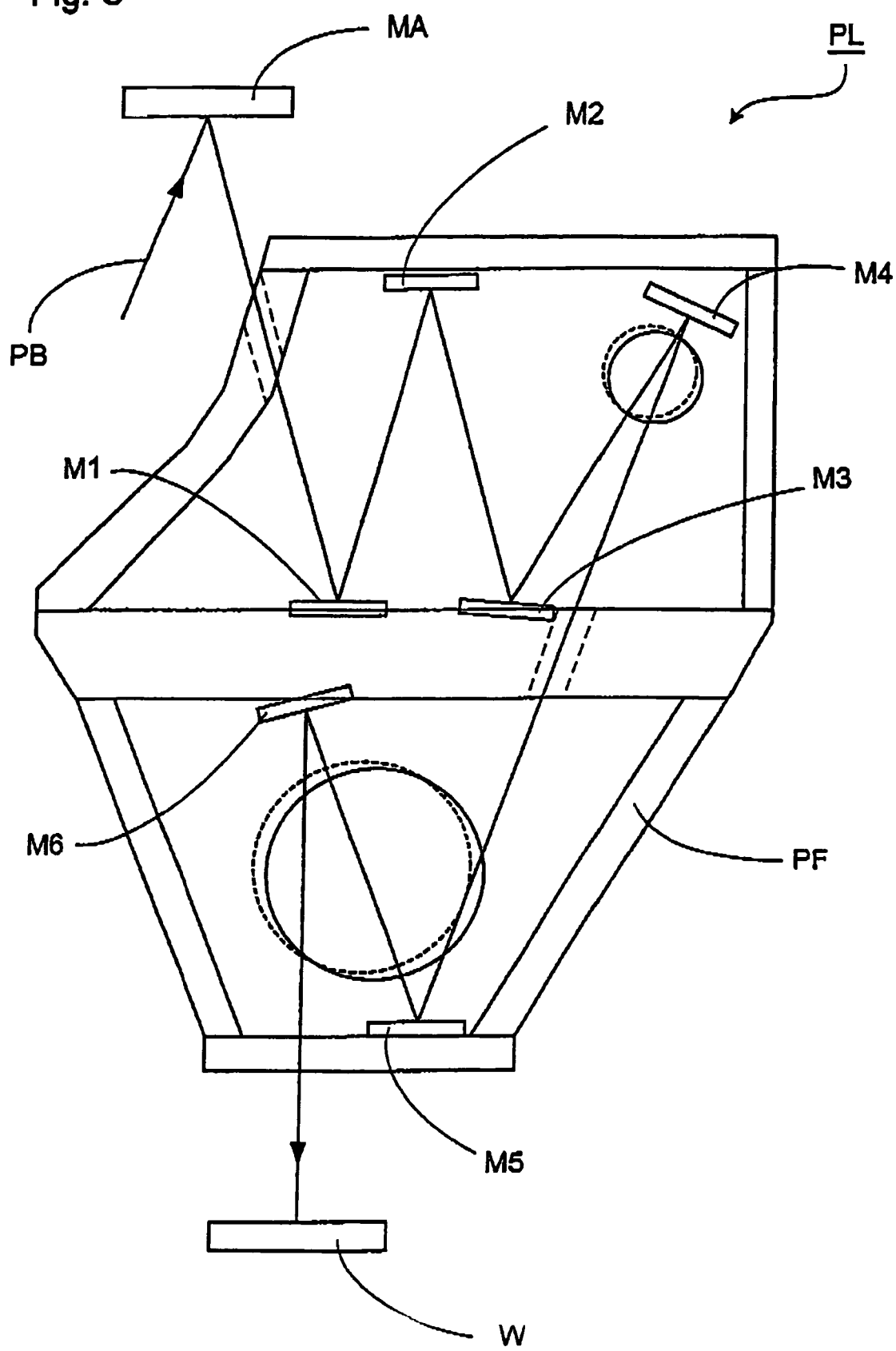
FIG. 3 depicts a projection system of the type used in the present invention.

FIG. 3 shows a projection system PL that may be used with the present invention. It comprises a projection frame PF, to which are mounted a plurality of optical elements M1, M2, M3, M4, M5, M6. The projection system of the present invention may further comprise a second projection frame (not shown in FIG. 2) to which sensors may be attached to monitor the position of the optical elements M1, M2, M3, M4, M5, M6. One or, preferably, both of the projection frames may be compliantly mounted on the reference frame. If only one projection frame is to be compliantly mounted on the reference frame, it may be desirable for this to be the second projection frame which then ensures a fully stable frame of reference to monitor the position of the optical elements M1, M2, M3, M4, M5, M6 within the projection system PL. Additionally compliantly mounting the first projection frame on the reference frame prevents force feedback through the reference frame.

The reference frame mounts 6 and the projection system mounts 7 may be any form of so-called soft-mounts. That is to say, the mounts 6, 7 may be any kind of mount with low stiffness. For instance, the mounts may be very soft springs, air-mounts (in which one part of the mount is supported relative to the other by a cushion of a volume of gas) or may be magnetic mounts (in which one part of the mount is supported relative to the other by a magnetic force).

Figure 6:
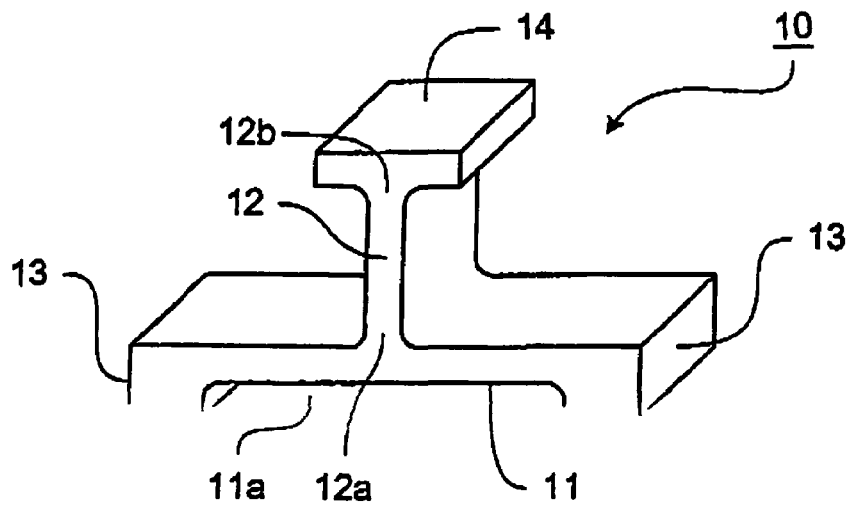
FIG. 6 depicts a compliant mount for supporting the projection system according to the present invention.

The mounts 6, 7, especially the projection system mounts 7, may, alternatively, be solid mounts. FIG. 6 shows a design of such a solid mount 10. The mount 10 includes a first elongate member 11 which is attached, by attachment points 13, at either end, to one of the reference frame 5 and the projection frame PF. A second elongate member 12 is connected to the first elongate member 11 at one end 12a and has an attachment point 14 at the other end 12b. The attachment point 14 is used to connect the mount 10 to the other of the reference frame 5 and the projection frame PF. The second elongate member 12 is connected to the first elongate member 11 between the two attachment points 13 on the first elongate member. Consequently, bending and flexure of the first and second elongate members 11, 12 provide relative movement between the attachment points 13 on the first elongate member and the attachment point 14 on the second elongate member. The frequency response of the mount 10 can be selected by using materials with appropriate stiffness and altered by adjusting the width and length of the first and second elongate members 11, 12. The mount may be formed from, for example, high tensile steel or Invar™ (a cobalt containing steel that has a relatively low coefficient of thermal expansion). It is preferred that the T-shaped mount 10 has an internal first eigenfrequency that is greater than 1000 Hz. In particular, it is preferred that the internal first eigenfrequency of the mount 10 is much larger than 1000 Hz.

As shown in FIG. 6, there is a space 11a below the first elongate member 11 and between the two attachment points 13 on the first elongate member 11. A block (not shown) may be provided in this space 11a to prevent large movements of the first elongate member 11.

Compliantly mounting the projection system PL onto the reference frame 5 may, however, result in displacement errors of the projection system PL relative to the reference frame 5. This will be especially true for vibrations that are close to the eigenfrequency of the mount. Therefore it may be necessary to provide damping of the motion of the projection system PL relative to the reference frame 5. The damping may be provided within the mounts themselves or may be applied at a different part of the projection frame PF. The damping applied may be passive or may be active using, for example, piezoelectric actuators or Lorentz-force actuators.

Figure 4:
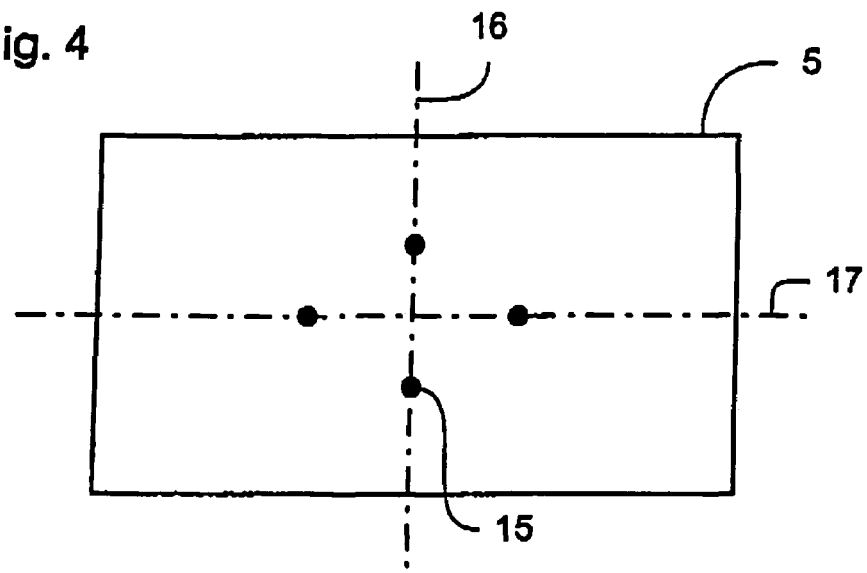
FIG. 4 depicts a reference frame of the present invention showing the mounting positions for mounting the projection system according to the present invention.

The choice of location of the mounts on the reference frame may also aid to reduce the amount of vibration and position error that is transmitted to the projection system PL. FIG. 4 shows a possible mounting location 15 for the projection system on the reference frame 5. The reference frame 5 may have torsional modes of vibration in which two axes 16, 17 in the plane of the frame are nodal. That is to say, when the reference frame 5 vibrates purely in this mode, the points on these nodal axes 16, 17 remain substantially motionless. Therefore by attaching the mounts at these locations 15, substantially no vibrations from this mode of vibration are transmitted to the projection system PL.

Figure 5:
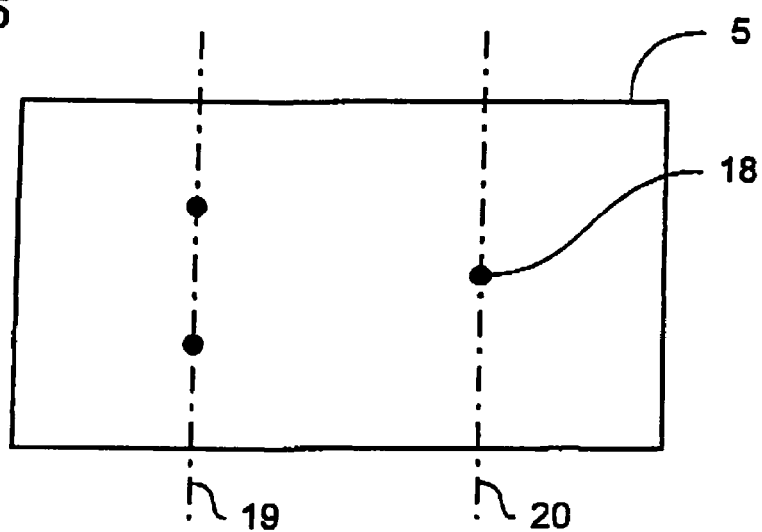
FIG. 5 depicts the reference frame of the present invention showing the mounting points for mounting the projection system according to an alternative embodiment of the present invention.

FIG. 5 shows an alternative arrangement in which the mounts are attached at locations 18 on the nodal axes for the dominant bending mode of vibration for the reference frame 5. Again, when the reference frame 5 vibrates predominantly in this mode, the nodal axes 19, 20 are substantially motionless and therefore vibrations in this mode are not transmitted to the projection system PL. The projection system may be mounted according to the configuration shown in FIG. 3 or FIG. 4, depending on which mode of vibration of the reference frame 5 (torsional or bending) is the most detrimental to the projection system.

In addition to the projection system, other components which are sensitive to vibration and displacement errors may be mounted on the reference frame. In particular, measurement sensors, for determining the position of, for example, the substrate table or the mask holder may be mounted on the reference frame. These components may also be mounted on the nodal axes of the reference frame.

While specific embodiments of the invention have been described above, it will be appreciated that the invention may be practiced otherwise than as described. The description is not intended to limit the invention.

What is claimed is:

1. A lithographic projection apparatus, comprising:
    a support configured to support a patterning device, the patterning device configured to pattern a beam of radiation according to a desired pattern;
    a substrate table configured to hold a substrate;
    a projection system configured to project the patterned beam onto a target portion of the substrate;
    a base to which the support and the substrate table are mounted;
    a reference frame compliantly mounted to the base;
    a projection frame compliantly mounted to the reference frame, the mounting of the projection frame to the reference frame being between the projection frame and the reference frame, and wherein the projection system comprises at least one optical element mounted on the projection frame;
    a second projection frame mounted to the reference frame; and
    sensors mounted to the second projection frame configured to monitor positions of optical elements mounted to the projection frame.

2. A lithographic projection apparatus according to claim 1, wherein an eigenfrequency of the projection frame compliantly mounted to the reference frame is between about 10 and 30 Hz.

3. A lithographic projection apparatus according to claim 1, wherein an eigenfrequency of the reference frame compliantly mounted to the base is about 0.5 Hz.

4. A lithographic projection apparatus according to claim 1, wherein the projection frame is compliantly mounted to the reference frame by at least three compliant mounts.

5. A lithographic projection apparatus according to claim 1, wherein the projection frame is compliantly mounted to the reference frame on nodal axes of a dominant mode of bending vibration of the reference frame or a torsional vibration of the reference frame.

6. A lithographic projection apparatus according to claim 1, wherein the second projection frame is compliantly mounted to the reference frame.

7. A lithographic projection apparatus according to claim 1, wherein the projection frame is compliantly mounted to the reference frame by at least one compliant mount that comprises an air-mount, or a spring, or a magnetic support.

8. A lithographic projection apparatus according to claim 1, wherein motion of the projection frame relative to the reference frame is damped.

9. A lithographic projection apparatus according to claim 8, wherein the motion of the projection frame relative to the reference frame is actively damped by piezoelectric actuators or Lorentz-force actuators.

10. A device manufacturing method, comprising:
    providing a substrate that is at least partially covered by a layer of radiation-sensitive material;
    projecting a patterned beam of radiation onto a target portion of the layer of radiation-sensitive material using a projection system;
    supporting, on a base, a reference frame, a support configured to support a patterning device, and a substrate table configured to hold the substrate, wherein the reference frame is compliantly mounted to the base and the projection system is compliantly mounted to the reference frame, the mounting of the projection system to the reference frame being between the projection system and the reference frame, while projecting the patterned beam of radiation onto the target portion; and
    monitoring positions of optical elements mounted to a projection frame of the projection system using sensors mounted on a second projection frame mounted to the reference frame.

11. A method according to claim 10, wherein the projection system comprises at least one optical element mounted on a projection frame that is compliantly mounted to the reference frame and an eigenfrequency of the projection frame compliantly mounted to the reference frame is between about 10 and 30 Hz.

12. A method according to claim 10, wherein an eigenfrequency of the reference frame compliantly mounted to the base is about 0.5 Hz.

13. A method according to claim 10, wherein the projection system is compliantly mounted to the reference frame by at least three compliant mounts.

14. A method according to claim 10, wherein the projection system is compliantly mounted to the reference frame on nodal axes of a dominant mode of bending vibration of the reference frame or a torsional vibration of the reference frame.

15. A method according to claim 10, wherein the second projection frame is compliantly mounted to the reference frame.

16. A method according to claim 10, wherein the projection system is compliantly mounted to the reference frame by at least one compliant mount that comprises an air-mount, or a spring, or a magnetic support.

17. A method according to claim 10, wherein motion of the projection system relative to the reference frame is damped.

18. A method according to claim 17, wherein the motion of the projection system relative to the reference frame is actively damped by piezoelectric actuators or Lorentz-force actuators.

19. A lithographic projection apparatus, comprising:
    a support configured to support a patterning device, the patterning device configured to pattern a beam of radiation according to a desired pattern;
    a substrate table configured to hold a substrate;
    a projection system configured to project the patterned beam onto a target portion of the substrate;
    a base to which the support and the substrate table are mounted;
    a reference frame mounted to the base;
    a projection frame mounted to the reference frame, wherein the projection system comprises at least one optical element mounted on the projection frame;
    a sensor frame on which is mounted sensors configured to monitor positions of optical elements mounted to the projection frame;
    at least one first isolation mount operative between the reference frame and the base to inhibit vibrations or movements of a predetermined type from being transmitted from the base to the reference frame; and
    at least one second isolation mount operative between the reference frame and the sensor frame to inhibit vibrations or movements of a predetermined type from being transmitted from the reference frame to the sensor frame.

20. A lithographic projection apparatus according to claim 19, wherein the projection frame is compliantly mounted to the reference frame on nodal axes of a dominant mode of bending vibration of the reference frame or a torsional vibration of the reference frame.

21. A lithographic projection apparatus according to claim 19, wherein motion of the projection frame relative to the reference frame is damped.

22. A lithographic projection apparatus, comprising:
a support configured to support a patterning device, the patterning device configured to pattern a beam of radiation according to a desired pattern;
a substrate table configured to hold a substrate;
a projection system configured to project the patterned beam onto a target portion of the substrate;
a base to which the support and the substrate table are mounted;
a reference frame compliantly mounted to the base;
a projection frame compliantly mounted to the reference frame on nodal axes of a dominant mode of bending vibration of the reference frame or a torsional vibration of the reference frame, the mounting of the projection frame to the reference frame being between the projection frame and the reference frame, and wherein the projection system comprises at least one optical element mounted on the projection frame.

* * * * *